(12) United States Patent
Naghshineh et al.

(10) Patent No.: US 6,723,691 B2
(45) Date of Patent: *Apr. 20, 2004

(54) POST CHEMICAL-MECHANICAL PLANARIZATION (CMP) CLEANING COMPOSITION

(75) Inventors: Shahriar Naghshineh, Allentown, PA (US); Jeff Barnes, Bath, PA (US); Ewa B. Oldak, Bethlehem, PA (US)

(73) Assignee: Advanced Technology Materials, Inc., Danbury, CT (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/781,859

(22) Filed: Feb. 12, 2001

(65) Prior Publication Data

US 2001/0004633 A1 Jun. 21, 2001

Related U.S. Application Data

(63) Continuation-in-part of application No. 09/587,883, filed on Jun. 6, 2000, now Pat. No. 6,492,308, which is a continuation-in-part of application No. 09/440,917, filed on Nov. 16, 1999, now Pat. No. 6,194,366.

(51) Int. Cl.$^7$ ............... C11D 1/62; C11D 3/30; C11D 3/43

(52) U.S. Cl. ............ 510/175; 510/175; 510/176; 510/245; 510/254; 510/499; 510/488; 510/477; 510/504

(58) Field of Search ................ 510/175, 176, 510/178, 245, 254, 499, 477, 504, 488; 134/1.2, 1.3, 41

(56) References Cited

U.S. PATENT DOCUMENTS

| 4,168,989 A | 9/1979 | Edelman et al. |
| 4,294,729 A | 10/1981 | Bakos et al. |

(List continued on next page.)

FOREIGN PATENT DOCUMENTS

| EP | 0647884 A1 | 6/1994 |
| EP | 0 723 205 A1 | 7/1996 |
| JP | 07 028254 A | 1/1995 |
| WO | WO 98/16330 | 4/1998 |
| WO | WO 00/14785 | 3/2000 |
| WO | WO 01/40425 A2 | 6/2001 |
| WO | WO 01/95381 A2 | 12/2001 |

OTHER PUBLICATIONS

Roy et al., "Postchemical–Mechanical Planarization Cleanup Process for Inter Layer Dielectric Films", J. Electrochem. Soc., 1:216–226, Jan. 1995.

(List continued on next page.)

Primary Examiner—Gregory Delcotto
(74) Attorney, Agent, or Firm—RatnerPrestia

(57) ABSTRACT

A cleaning solution for cleaning microelectronic substrates, particularly for post-CMP or via formation cleaning. The cleaning solution comprises a quaternary ammonium hydroxide, an organic amine, a corrosion inhibitor, optionally an organic acid, and water. A preferred cleaning solution comprises tetramethylammonium hydroxide, monoethylanolamine, gallic acid ascorbic acid, and water with the alkalinity of the cleaning solution greater than 0.073 milliequivalents base per gram of solution.

8 Claims, 15 Drawing Sheets

U.S. PATENT DOCUMENTS

| | | |
|---|---|---|
| 4,395,348 A | 7/1983 | Lee |
| 4,487,708 A | 12/1984 | Muccitelli |
| 4,610,953 A | 9/1986 | Hashimoto et al. |
| 4,617,251 A | 10/1986 | Sizensky |
| 4,744,834 A | 5/1988 | Haq |
| 4,765,844 A | 8/1988 | Merrem et al. |
| 4,770,713 A | 9/1988 | Ward |
| 4,859,418 A | 8/1989 | Ohlendorf et al. |
| 4,888,244 A | 12/1989 | Masubuchi et al. |
| 5,091,103 A | 2/1992 | Dean et al. |
| 5,143,648 A | 9/1992 | Satoh et al. |
| 5,185,235 A | 2/1993 | Sato et al. |
| 5,190,723 A | 3/1993 | Phillips et al. |
| 5,279,771 A | 1/1994 | Lee |
| 5,308,745 A | 5/1994 | Schwartzkopf |
| 5,334,332 A | 8/1994 | Lee |
| 5,381,807 A | 1/1995 | Lee |
| 5,407,788 A | 4/1995 | Fang |
| 5,417,877 A | 5/1995 | Ward |
| 5,419,779 A | 5/1995 | Ward |
| 5,419,877 A | 5/1995 | Goforth et al. |
| 5,466,389 A | 11/1995 | Ilardi et al. |
| 5,476,606 A | 12/1995 | Brancaleoni et al. |
| 5,482,566 A | 1/1996 | Lee |
| 5,496,491 A | 3/1996 | Ward et al. |
| 5,556,482 A | 9/1996 | Ward et al. |
| 5,563,119 A | 10/1996 | Ward |
| 5,567,574 A | 10/1996 | Hasemi et al. |
| 5,580,846 A * | 12/1996 | Hayashida et al. ......... 510/175 |
| 5,597,420 A | 1/1997 | Ward |
| 5,648,324 A | 7/1997 | Honda et al. |
| 5,665,688 A | 9/1997 | Honda et al. |
| 5,698,503 A | 12/1997 | Ward et al. |
| 5,704,987 A | 1/1998 | Huynh et al. |
| 5,707,947 A | 1/1998 | Ward et al. |
| 5,709,756 A | 1/1998 | Ward et al. |
| 5,753,601 A | 5/1998 | Ward et al. |
| 5,756,398 A | 5/1998 | Wang et al. |
| 5,783,495 A | 7/1998 | Li et al. |
| 5,846,921 A | 12/1998 | Gil et al. |
| 5,855,811 A | 1/1999 | Grieger et al. |
| 5,863,344 A | 1/1999 | Nam |
| 5,922,136 A | 7/1999 | Huang |
| 5,932,021 A | 8/1999 | Cala et al. |
| 5,935,871 A | 8/1999 | Farkas et al. |
| 5,988,186 A | 11/1999 | Ward et al. |
| 5,989,353 A | 11/1999 | Skee et al. |
| 5,997,658 A | 12/1999 | Peters et al. |
| 6,030,932 A * | 2/2000 | Leon et al. ................. 510/175 |
| 6,060,439 A * | 5/2000 | Doyel et al. ................ 510/164 |
| 6,152,148 A * | 11/2000 | George et al. ................ 134/2 |
| 6,191,086 B1 * | 2/2001 | Leon et al. ................. 510/175 |
| 6,194,366 B1 * | 2/2001 | Naghshineh et al. ........ 510/175 |
| 6,492,308 B1 * | 12/2002 | Naghshineh et al. ........ 510/175 |

OTHER PUBLICATIONS

Pourbaix, Marcel, "Atlas of Electrochemical Equilibria in Aqueous Solutions", National Assoc. of Corrosion Engineers, Houston, TX, pp. 70–83, 1969.

Huang et al., "Electrochemical Behavior of Copper in Tetramethyl Ammonium Hydroxide Based Solutions", Symposium P. Proceedings of the Materials Research Society, 566, Apr. 5–7, 1999.

Peters, L., "Clean Processing: A Host of Challenges for Copper CMP Cleaning", Semiconductor International, Mar. 1998.

Hymes et al., "The Challenges of the Copper CMP Clean", Semiconductor International, Jun. 1998.

Search Report dated Sep. 20, 2002 for International Application No. PCT/US 02/03422 dated Feb. 6, 2002.

* cited by examiner

Image Statistics
Img. Z range  45.165 nm
Img. Mean  −0.000001 nm
Img. Raw mean  3.821 nm
Img. Rms (Rq)  3.815 nm
Img. Ra  2.733 nm Box Statistics
Z range
Mean
Raw mean
Rms (Rq)
Mean roughness (Ra)
Box x dimension
Box y dimension

POST CHEMICAL-MECHANICAL PLANARIZATION (CMP) CLEANING COMPOSITION

CROSS REFERENCE TO RELATED APPLICATIONS

This application is a continuation-in-part of U.S. patent application Ser. No. 09/587,883 filed Jun. 6, 2000, now U.S. Pat. No. 6,492,308, which is a continuation-in-part of U.S. patent application Ser. No. 09/440,917 now U.S. Pat No. 6,194,366, filed Nov. 16, 1999.

FIELD OF THE INVENTION

The present invention relates generally to the field of post chemical-mechanical polishing (post-CMP) cleaning operations, and more specifically to post-CMP cleaning solutions for copper-containing microelectronic substrates.

BACKGROUND OF THE INVENTION

The present day fabrication of semiconductor devices is a complex, multi-step process. The Chemical-Mechanical Polishing (CMP) process is now a well-established enabling technology used by most advanced semiconductor operations for planarization of various substrates for production of devices with design geometries of less than 0.35 micron.

The CMP processes involve holding and rotating a thin, flat substrate of the semiconductor material against a wetted polishing surface under controlled chemical, pressure and temperature conditions. A chemical slurry containing a polishing agent, such as alumina or silica, is used as the abrasive material. In addition, the chemical slurry contains selected chemicals, which etch various surfaces of the substrate during processing. The combination of mechanical and chemical removal of material during polishing results in superior planarization of the surface.

The CMP process, however, leaves contamination on the surfaces of the semiconductor substrate. This contamination is comprised of abrasive particles from the polishing slurry, which may consist of alumina or silica with reactive chemicals added to the polishing slurry. In addition, the contaminant layer may comprise reaction products of the polishing slurry and the polished surfaces. It is necessary to remove the contamination prior to subsequent processing of the semiconductor substrate in order to avoid degradation in device reliability and to avoid the introduction of defects which reduce the manufacturing process yield. Thus, post-CMP cleaning solutions have been developed to cleanse the substrate surface of CMP residuum.

Alkaline solutions based on ammonium hydroxide have been traditionally used in post-CMP cleaning applications. To date, most CMP applications have been directed to aluminum, tungsten, tantalum, and oxide-containing surfaces.

However, copper is increasingly becoming a material of choice in the production of interconnects in semiconductor fabrication. Copper is replacing aluminum as the metal of choice in such fabrication. Conventional post-CMP processes are inadequate for cleaning surfaces containing copper. Copper, copper residue, and the slurry particles are the contaminants that exist on the copper and other exposed surfaces following this CMP process. The copper contamination diffuses quickly in silicon and silicon dioxide and other dielectric materials. Therefore, it must be removed from all exposed surfaces including the backside of the wafer to prevent device failure.

Post-CMP cleaning solutions that are traditionally effective on alumina and silica-based CMP processes are not effective on copper-containing surfaces. Copper is easily damaged by these cleaning solutions. In addition, cleaning efficacy with the present post-CMP cleaning solutions has been proven unacceptable.

Nam, U.S. Pat. No. 5,863,344, discloses a cleaning solution for semiconductor devices containing tetramethyl ammonium hydroxide, acetic acid, and water. The solution preferably contains a volumetric ratio of acetic acid to tetramethyl ammonium hydroxide ranging from about 1 to about 50.

Ward, U.S. Pat. No. 5,597,420, discloses an aqueous stripping composition useful for cleaning organic and inorganic compounds from a substrate that will not corrode or dissolve metal circuitry in the substrate. The disclosed aqueous composition contains preferably 70 to 95 wt % monoethanolamine and a corrosion inhibitor at about 5 wt % such as catechol, pyrogallol or gallic acid.

Ward, U.S. Pat. No. 5,709,756, discloses a cleaning composition containing about 25 to 48 wt % hydroxylamine, 1 to 20 wt % ammonium fluoride, and water. The pH of the solution is greater that 8. The solution may further contain a corrosion inhibitor such as gallic acid, catechol, or pyrogallol.

Hardi et al., U.S. Pat. No. 5,466,389, discloses an aqueous alkaline cleaning solution for cleaning microelectronic substrates. The cleaning solution contains a metal ion-free alkaline component such as a quaternary ammonium hydroxide (up to 25 wt %), a nonionic surfactant (up to 5 wt %), and a pH-adjusting component, such as acetic acid, to control the pH within the range of 8 to 10.

Schwartzkopf et al., European Patent No. 0647884A1 discloses photoresist strippers containing reducing agents to reduce metal corrosion. This patent teaches the use of ascorbic acid, gallic acid pyrogallol among others for the control of metal corrosion in alkali containing components.

U.S. Pat. No. 5,143,648 to Satoh et al., which is herein incorporated by reference, discloses novel ascorbic acid derivatives as antioxidants.

There is a need for a post-CMP cleaning composition for copper-containing surfaces. Such a post-CMP cleaning composition must effectuate substantial particle removal from the target surface and prevent corrosion of the copper-containing substrate. Such a post-CMP cleaning composition must also refrain from attacking the process equipment used in the post-CMP process. Such a post-CMP cleaning composition should also be economical, work effectively through a wide temperature range. Such a post-CMP cleaning composition should also be useful in cleaning utilizing alumina or silica-based slurries.

SUMMARY OF THE INVENTION

According to the present invention aqueous cleaning solutions for cleaning copper containing micro electronic substrates consist of a quaternary ammonium hydroxide, a polar organic amine, a corrosion inhibitor and deionized water.

Ascorbic acid by a wide margin is the most effective corrosion inhibitor when used in an alkaline solution for cleaning copper containing microelectronic substrates. We have found that addition of an organic acid, e.g. gallic acid to these compositions can improve the cleaning properties without sacrificing the effectiveness of the ascorbic acid as a corrosion inhibitor. Thus in some applications users may desire an addition of gallic acid to the cleaning composition.

The present invention is a cleaning solution for cleaning copper-containing microelectronic substrates comprising a quaternary ammonium hydroxide selected from the group consisting of tetraalkylammonium hydroxide, where the alkyl contains C atoms numbered from 1 to 10, and combinations thereof; an organic amine selected from the group consisting of monoethanolamine, aminoethylethanolamine, N-methylaminoethanol, aminoethoxyethanol, diethanolamine, triethanolamine, $C_2$–$C_5$ alkanolamines, and combinations thereof, optionally an organic acid, e.g. gallic acid; and a corrosion inhibitor selected from the group consisting of ascorbic acid, L(+)-ascorbic acid, isoascorbic acid, ascorbic acid derivatives, catechol, pyrogallol, resorcinol, hydroquinone, benzotriazole, and combinations thereof. The alkalinity of the solution is greater than 0.073 milliequivalents base per gram.

According to the invention an effective cleaning solution for cleaning copper-containing microelectronic substrates comprises; a) tetramethylammonium hydroxide, b) monoethanolamine, c) gallic acid, d) ascorbic acid, and deionized water. The alkalinity of the solution is greater than 0.073 milliequivalents base per gram.

Preferably, tetramethylammonium hydroxide is in the cleaning solution in an amount in the range from about 0.15 wt % to about 1.25 wt %, monoethanolamine is in the solution in an amount in the range from about 0.2 wt % to about 2.25 wt %, gallic acid in an amount in the range from 0.1 wt % to about 0.4 wt %, and ascorbic acid is in the solution in an amount in the range from about 0.10 wt % to about 0.9 wt %, balance deionized water.

A concentrate composition for a cleaning solution for cleaning copper-containing microelectronic substrates is also provided. The concentrate composition comprises tetramethylammonium hydroxide in an amount in the range from about 1.8 wt % to about 12.4 wt %, monoethanolamine in an amount in the range from about 2.0 wt % to about 27.8 wt %, gallic acid in an amount in the range of 0 wt % to about 4.0 wt %, ascorbic acid in an amount in the range from about 1.0 wt % to about 10.9 wt %, and the balance deionized water. An effective cleaning solution can me be achieved by mixing from about 1.5 wt % to 12.5 wt % of the concentrate with with deionized water.

DETAILED DESCRIPTION OF THE INVENTION

Figure 1:
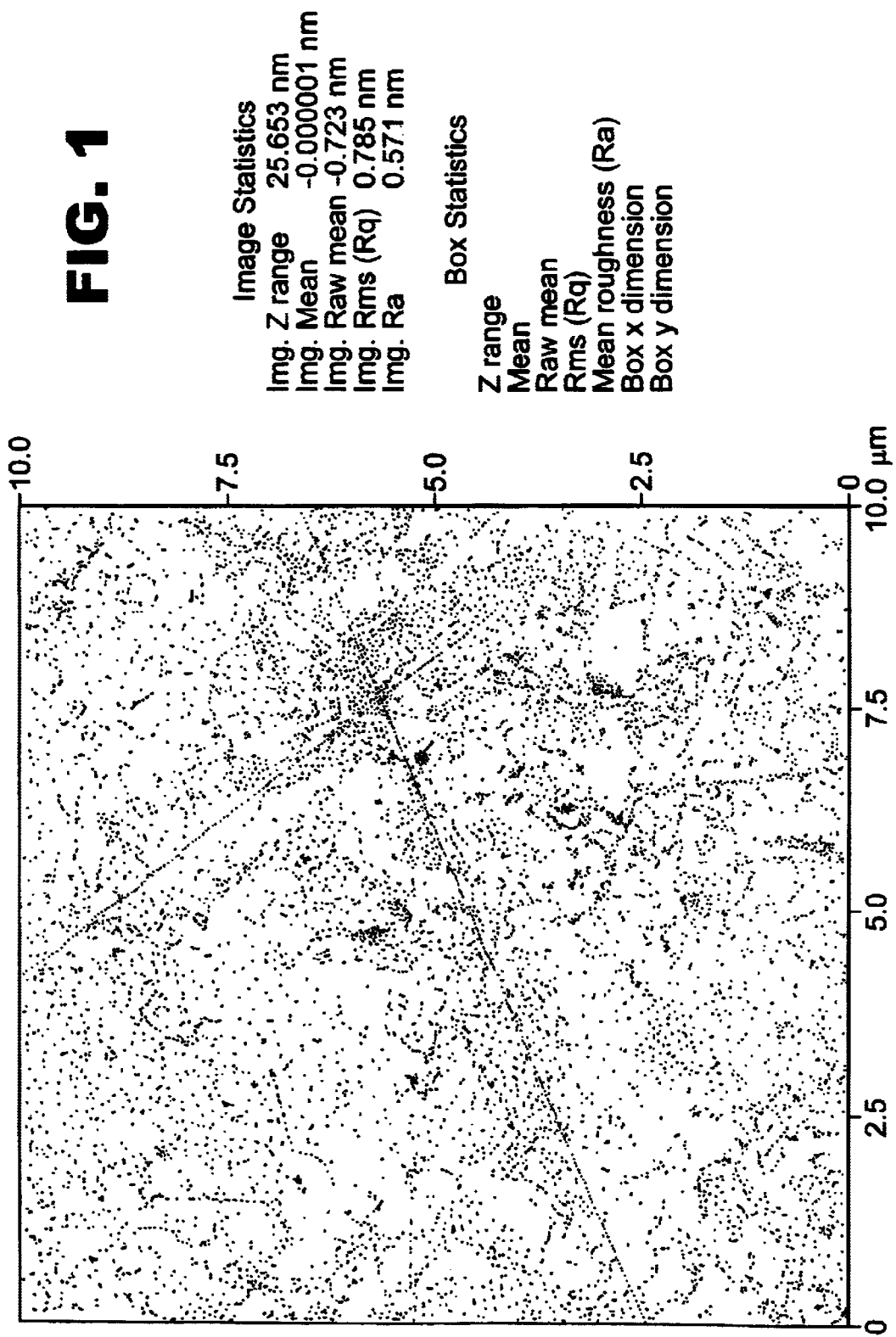
FIG. 1 is an atomic force microscopy (AFM) scan at 10 $\mu$m×10 $\mu$m area of a partially polished electrochemically copper deposited on a substrate.

A cleaning solution for cleaning copper-containing microelectronic substrates following CMP processing is provided. Cleaning copper-containing substrates following CMP processing is generally referred to as "Post CMP copper clean". A "copper-containing microelectronic substrate" is understood herein to refer to a substrate surface manufactured for use in microelectronic, integrated circuit, or computer chip applications, wherein the substrate contains copper-containing components. Copper-containing components may include, for example, metallic interconnects that are predominately copper or a copper alloy. It is understood that the microelectronic surface may also be composed of semiconductor materials, such as TiN, Ta, TiW as copper diffusion barrier metals and silica or other dielectric materials. Generally, a copper-containing microelectronic substrate contains a significant amount of Cu, including the copper interconnects.

The cleaning solution of the invention may find application for any cleaning operation during the fabrication of microelectronic substrates, such as semiconductor wafers. Most notably, such cleaning applications include post-Via formations and post-CMP processes. The fabrication of conventional semiconductor wafers entails many steps requiring planarization, followed by the removal of residual product from the planarization process.

The cleaning solution of the invention comprises a quaternary ammonium hydroxide, an organic amine, an organic acid, a corrosion inhibitor, and the balance water. The quanternary ammonium hydroxide is selected from the group consisting of tetraalkylammonium hydroxide where the alkyl contains C atoms numbered from 1 to 10 and combinations thereof. Quaternary ammonium hydroxide is present in the solution in an amount from about 0.15 wt % to about 1.75 wt %.

The polar organic amine is selected from the group consisting of monoethanolamine, aminoethylethanolamine, methylaminoethanol, aminoethoxyethanol, diethanolamine, triethanolamine, $C_2$–$C_5$, alkanolamines, and combinations thereof. The polar organic amine is present in the solution in an amount from about 0.25 wt % to about 27.5 wt %.

The organic acid is gallic acid in an amount in the range from 0.1 wt % to about 0.4 wt %.

The corrosion inhibitor is selected from the group consisting of ascorbic acid, L(+)-ascorbic acid, isoascorbic acid, ascorbic acid derivatives, catechol, pyrogallol, resorcinol, hydroquinone, benzotriazole, and combinations thereof.

Corrosion inhibitor is present in the solution in an amount from about 0.1 wt % to about 1 wt %. It is desirable to obtain the optimal amount of corrosion while effectively cleaning of the wafer surface in such way that the copper residum and other contamination are removed from the surface. Therefore, for optimal cleaning, the process usually induces a slight amount of copper loss at the wafer surface, but maintains the electrical properties of the wafer.

The alkalinity of the solution is greater than 0.073 milliequivalents base per gram.

Ascorbic acid and its derivatives have been used extensively as antioxidants in food and medicine. They have also been found to be successful corrosion inhibitors for metals or metal alloys existing in an aqueous or solvent environment as revealed in various patent literature. Ascorbic acid and other components of the invention are readily available commercially.

An important feature of the cleaning solution of the invention is that the non-aqueous constituents (the constituents other than water) are present in the solution in small quantities. This is an economic advantage since an effective cleaning solution can be formulated more cheaply, which is of importance since such post-CMP cleaning solutions are used in large quantities.

In one embodiment of the invention, a concentrated composition is provided that can be diluted as needed for achieving a cleaning solution. A concentrated composition of the invention, or "concentrate", advantageously permits a CMP process engineer, for example, to dilute the concentrate to the desired strength and alkalinity. A concentrate also permits longer shelf life, easier shipping and storage of the product.

A concentrate of the invention preferably comprises TMAH in an amount in the range from about 1.8 to about 12.4 wt %, MEA in an amount in the range from about 2.0 to about 27.8 wt %, gallic acid in the range from 0.1 to about 4.0 wt %, ascorbic acid in an amount in the range from about 1.0 to about 10.9 wt %, and the balance water (preferably deionized water).

Additionally, the concentrate of the invention can also contain a chelating agent for further prevention of deposition of undesirable metal contaminants on the wafer surfaces. Well-known metal complex agents for Zn, Cu, Ni, Fe, etc. can be introduced into the formulation. It is also known that the metal protection capability of the corrosion inhibitors in many cases is associated with the complex forming properties of the organic complex-forming agents.

A concentrate according to the invention is preferably diluted for use in post-CMP cleaning applications by adding deionized water until the concentrate is from about 1.5 wt % to about 12.5 wt % of the prepared cleaning solution. The cleaning solution of the invention may be employed for cleaning microelectronic substrates at temperatures ranging from ambient conditions to about 70° C. It is generally recognized that cleaning improves as temperature increases.

The alkalinity of the solution is greater than 0.073 milliequivalents base per gram. More preferably, the alkalinity of the solution is greater than 0.091 milliequivalents base per gram. An alkalinity of greater than 0.073 is necessary to obtain a negative zeta potential on the surface of the substrate and the remaining particulates during the cleaning operation.

The cleaning solution of the invention meets generally accepted industry cleaning performance standards for post-CMP applications. A common industrial cleaning target is a particle count on the substrate wafer of less than 20 particles greater than 0.2 microns in size for a 200 mm wafer, with a 5 mm edge exclusion.

The cleaning solution of the invention does not require a surfactant in the formulation however this does not preclude their use in specific applications.

The cleaning solution of the invention may be used with a large variety of conventional cleaning tools, including Verteq single wafer megasonic Goldfinger, On Trak systems, DDS (double-sided scrubbers), SEZ single wafer spin wash and megasonic batch wet bench systems.

The cleaning solution of the invention may be used successfully on surfaces containing copper, tungsten, and/or silica.

As noted, via cleaning is one application for the cleaning solution of the invention. Vias are holes etched in microelectronic substrates to provide a conduit for connecting metal layers. Etching the substrate surface with a gaseous etchant forms Vias. The substrate is commonly a dielectric material, such as Fluorinated Silica Glass (FSG). The residue remaining on the substrate surface and Via walls must be removed following the etching process. The residue is often referred to as "side wall polymer", as it is also found on the vertical walls of the Via. Etching residue may also be located at the bottom of the Via, on top of the metal. The cleaning solution of the invention does not react with or affect the exposed dielectric material.

The following Examples are merely illustrative of the invention and are not intended to be limiting.

EXAMPLE 1

Tests were conducted to evaluate the relative cleaning performance of post-CMP cleaning solutions of varying composition. Cleaning solutions were prepared by mixing deionized water TMAH, ascorbic acid or gallic acid and one of three amine compounds (MEA, hydroxylamine, or N-monoethanolamine). The composition of the prepared cleaning solutions is set forth in Table 1. For purposes of comparison, two additional cleaning solutions were prepared: Solution 10 was 1.7 wt % $NH_4OH$ in deionized water and Solution 11 was 1:2:10 $NH_4OH:H_2O_2:H_2O$. The pH of each cleaning solution was measured.

"Dip tests" were conducted using pre-cleaned Fisher 12-550-10 glass microscope slides. In the following procedures, all dips were undertaken for 5 sec., and handled with plastic forceps. A sample slide was first dipped into a CMP oxide slurry (Ultraplane P-1500), then dipped into 250 ml of deionized water, and then into a W-CMP slurry (1:1 dilution of Ultraplane-MC W CMP base and deionized water). Each slide was then dipped into 250 ml deionized water, then into the subject cleaning solution. Each slide was then dipped into 100 ml deionized water, then dipped into another separate deionized water bath. The slides were hung to air dry under ambient conditions. Between each test, all deionized water baths were replaced.

Dried slides were visually evaluated for evidence of remaining CMP slurry, as evidenced by the degree of cloudiness observed on the slide. The dried slides were compared and ranked from best to worst.

The results are shown in Table I.

TABLE I

COMPARATIVE DIP TEST

| | Amine | TMAH (wt %) | A-mine (wt %) | Ascorbic Acid (wt %) | Gallic Acid (wt %) | Titration Alkalinity Meq./gram of solution | Relative Rank |
|---|---|---|---|---|---|---|---|
| 1 | MEA | 0.5 | 0.9 | 0.2 | — | 0.191 | 1 |
| 2 | MEA | 0.5 | 0.9 | 0.35 | — | 0.182 | 2 |
| 3 | MEA | 0.5 | 0.9 | — | 0.35 | 0.182 | 3 |
| 4 | NMEA | 0.5 | 0.9 | — | 0.35 | 0.154 | 4 |
| 5 | MEA | 0.5 | 0.9 | — | 0.1 | 0.196 | 5 |
| 6 | HA | 0.66 | 0.3 | — | 0.233 | 0.235 | 6 |
| 7 | HA | 0.66 | 0.6 | — | 0.233 | 0.284 | 7 |
| 8 | HA | 0.33 | 0.3 | — | 0.467 | 0.122 | 8 |
| 9 | HA | 0.33 | 0.6 | — | 0.467 | 0.171 | 9 |
| 10 | — | — | — | — | — | 0.485 | 10 |
| 11 | — | — | — | — | — | NA | 11 |

The results indicate that preferred embodiments of the invention performed best (solutions 1 and 2). All solutions of the invention performed better than cleaning solutions of the prior art (solutions 10 and 11).

EXAMPLE 2

Cleaning solutions (A through H) were evaluated for the tendency to corrode copper. Solution A consisted of 0.9 wt % MEA, 0.5 wt % TMAH and 0.35 wt % (L)-ascorbic acid. Solution B consisted of 0.9 wt % MEA, 0.5 wt % TMAH and 0.18 wt % (L)-ascorbic acid and the balance deionized water. Solution C consists of 0.5 wt % TMAH in water. Solution D consists of 0.9 wt % MEA, in water. Solution E consists of 0.9 wt % MEA, 0.5 wt % TMAH and 0.35 wt % gallic acid and the balance water. Solution F consist of 0.9 wt % MEA 0.5 wt % TMAH and 0.18 wt % gallic acid and 0.18 wt % benzotriazole and the balance water. Copper strips of uniform length and width were obtained from an entire piece of electrochemically deposited (ECD) copper wafer (partially polished), then placed in 200 ml of the sample cleaning solution for 2 minutes with stirring under ambient conditions. The copper wafer strips were thereafter removed from the cleaning solution, rinsed with deionzed water, and nitrogen dried. The copper wafer strips were visually inspected for color changes and loss of gloss. Both are evidence of corrosion. These treated copper wafer strips were subjected to AFM examination for surface corrosion.

The corrosion results are set forth in Table II.

TABLE II

Corrosion Test Data

| Composition | Substrate | Test Method | Results |
|---|---|---|---|
|  | Cu (ECD, partially polished) | AFM | RMS = 0.8 slight pitting after polishing |
| Solution A | Cu (ECD, partially polished) | AFM | RMS = 1.0 minimal pitting minimal Cu attack |
| Solution B | Cu (ECD, partially polished) | AFM | RMS = 1.1 minimal pitting minimal Cu attack |
| Solution C | Cu (ECD, partially polished) | AFM | RMS = 0.9 slight pitting moderate Cu attack |
| Solution D | Cu (ECD, partially polished) | AFM | RMS = 3.4 slight pitting, moderate Cu attack |
| Solution E | Cu (ECD, partially polished) | AFM | RMS = 3.5 slight pitting moderate Cu attack |
| Solution F | Cu (ECD, partially polished) | AFM | RMS = NA surface modified by BTA |
| Solution G(1) | Cu (ECD, partially polished) | AFM | RMS = 1.3 minimal pitting, slight Cu attack |
| Solution H(2) | Cu (ECD, partially polished) | AFM | RMS = 3.8 slight pitting, moderate Cu attack |

*RMS = root mean square roughness via AFM.
(1)Buffered HF Solution
(2)1.7 wt % $NH_4OH$ in water The data in Table II indicate a preferred embodiment of the invention (solution A) performed very well in terms of copper corrosion protection. Solutions A and B differ in the amount of corrosion inhibitor concentration.

Figure 2:
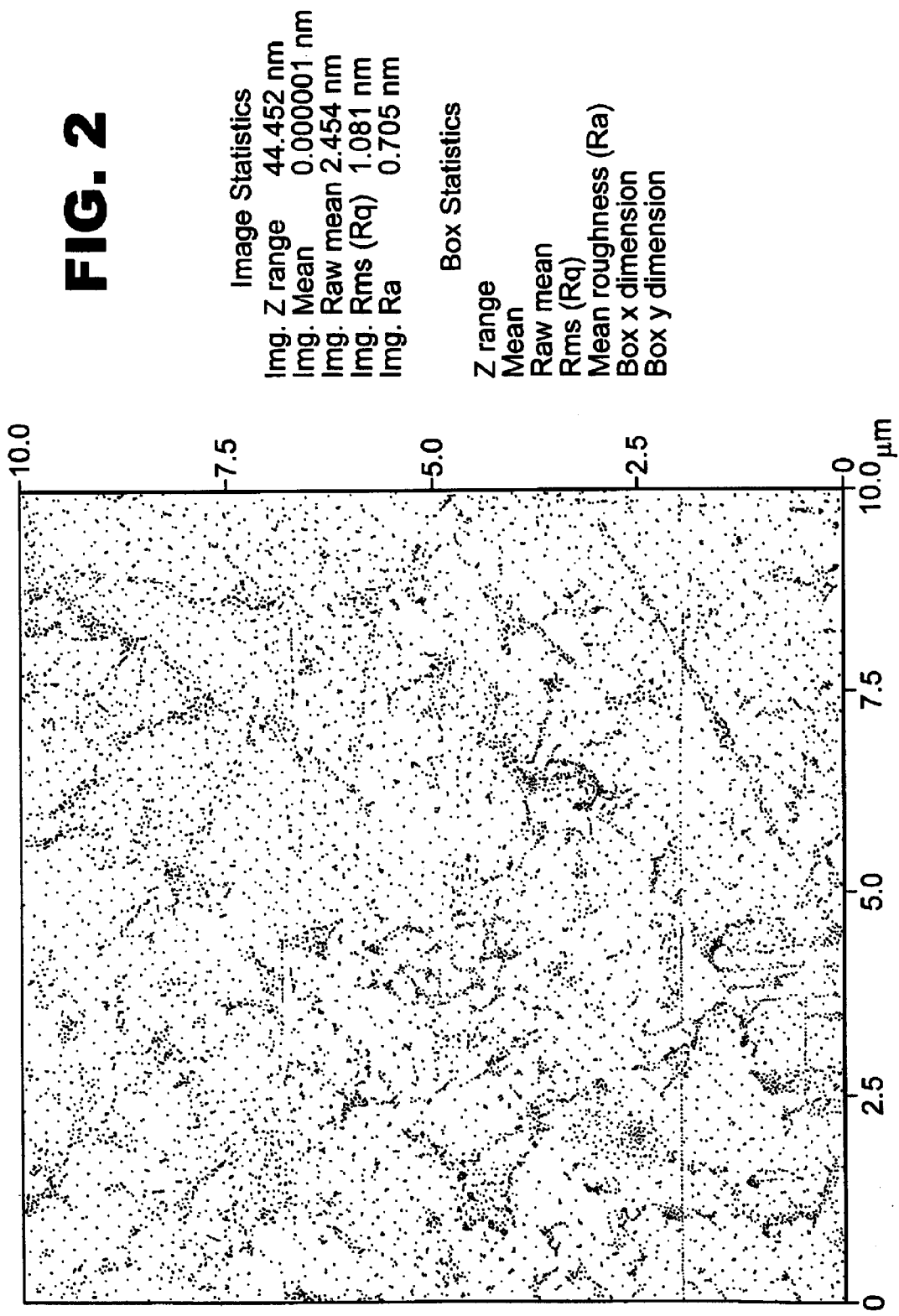
FIG. 2 is an atomic force microscopy (AFM) scan at 10 $\mu$m×10 $\mu$m area of the wafer of FIG. 1 treated with a solution according to the present invention.
Figure 3:
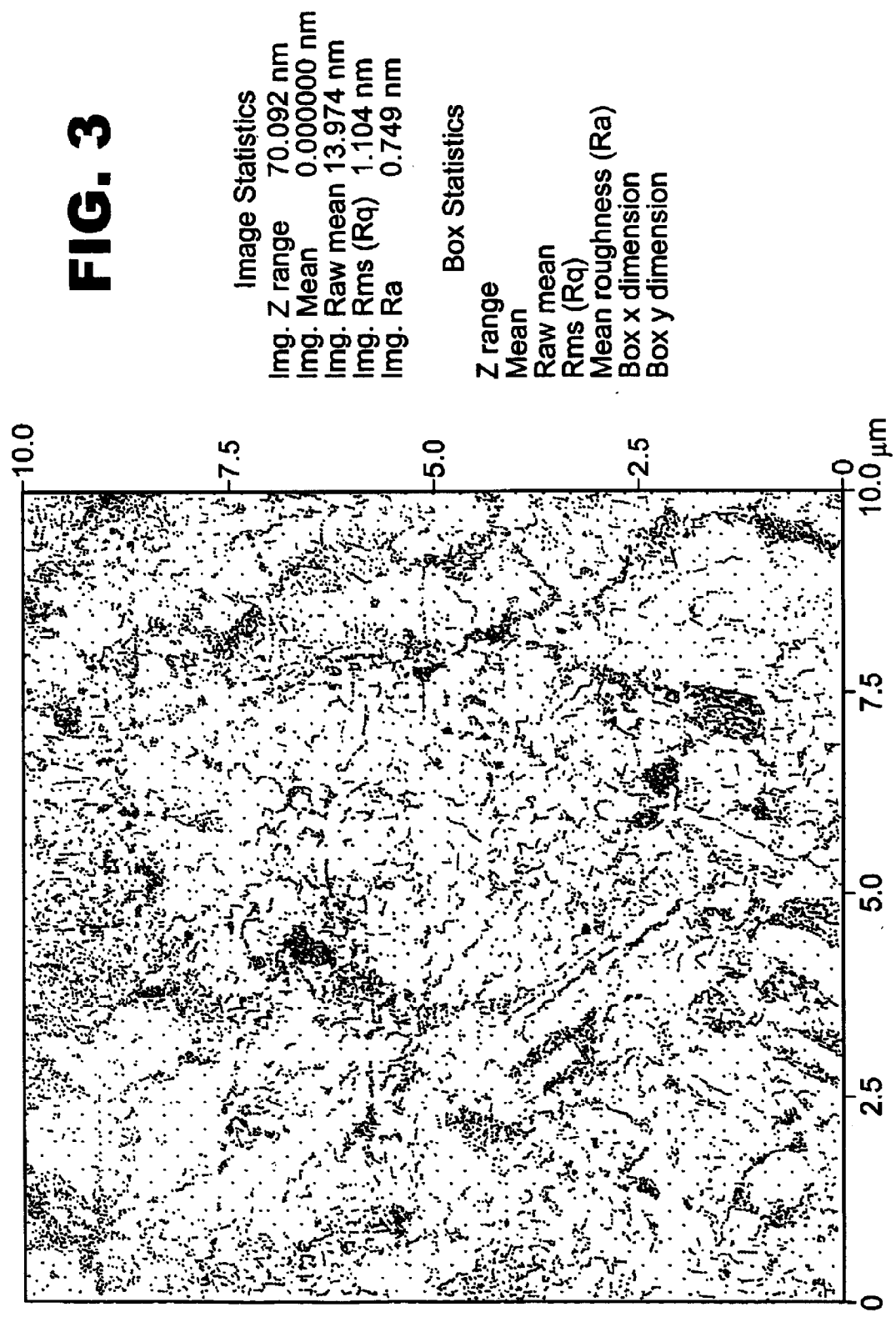
FIG. 3 is an atomic force microscopy (AFM) scan at 10 $\mu$m×10 $\mu$m area of the wafer in FIG. 1 treated with a solution according to the present invention.
Figure 4:
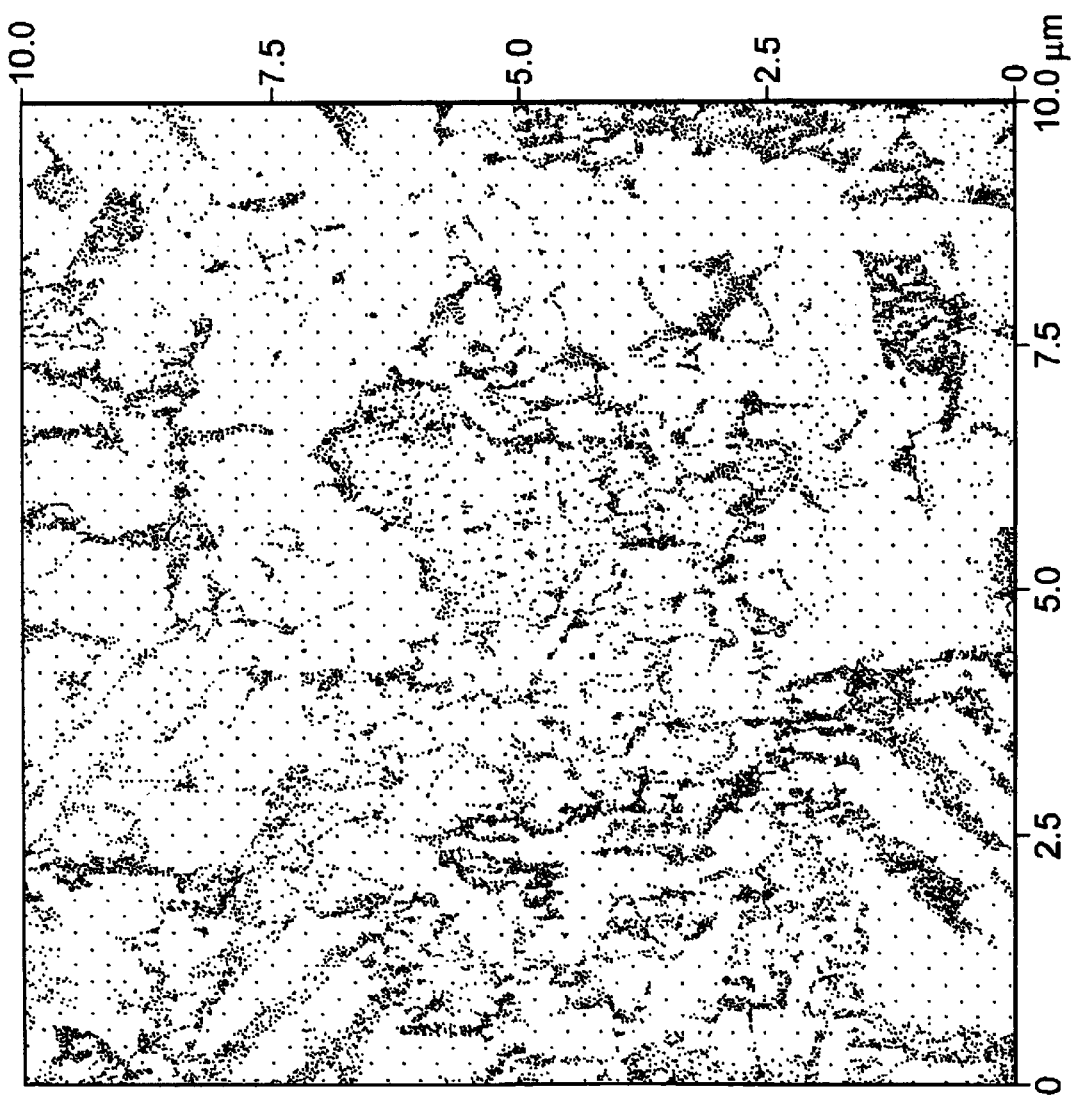
FIG. 4 is an atomic force microscopy (AFM) scan at 10 $\mu$m×10 $\mu$m area of the wafer in FIG. 1 treated with a solution according to the present invention.

Examples of AFM scans with RMS roughness data are shown in FIGS. 1–4 wherein FIG. 1 is the untreated electrochemically deposited (ECD) copper wafer, FIG. 2 is an identical wafer exposed to solution A, FIG. 2 is an ECD wafer exposed to solution B, and FIG. 4 is an ECD wafer exposed to a solution consisting of 0.9 wt % MEA, 0.5 wt % TMAH, 0.35 wt % gallic acid, balance water.

EXAMPLE 3

A series of cleaning solutions were prepared to evaluate the relationship between TMAH, MEA, and ascorbic acid in aqueous cleaning solutions. Cleaning solutions were prepared by combining TMAH, MEA, ascorbic acid, and deionized water such that the concentration of TMAH wt % was 0.5 wt %; and the concentration of MEA varied from 0 wt % to 0.9 wt %; the concentration of ascorbic acid varied from 0 wt % to 0.35 wt %; and deionized water is in the balance amount. These test solutions were prepared as set forth in Table III. The prepared cleaning solutions were evaluated for cleaning performance according to the glass slide dip test procedure set forth in Example 1.

The results are shown in Table III.

TABLE III

| Composition | A | B | C | D | E | F | G |
|---|---|---|---|---|---|---|---|
| TMAH (Weight %) | 0.5 | X | X | 0.5 | 0.5 | X | 0.5 |
| MEA (Weight %) | 0 | 0.9 | X | 0.9 | X | 0.9 | 0.9 |
| Ascorbic Acid (Weight %) | X | X | 0.35 | X | 0.35 | 0.35 | 0.35 |
| Water (Weight %) | 99.50 | 99.10 | 99.65 | 98.60 | 99.15 | 98.75 | 98.25 |
| Composition Alkalinity Meq./gram of solution | 0.055 | 0.147 | −0.020 | 0.202 | 0.035 | 0.127 | 0.182 |
| Dip Test Rating* | 3 | 5 | 5 | 3 | 5 | 5 | 1 |

*1 = good, 3 = fair, and 5 = poor

The results indicate that the solutions that performed best as cleaning agents in the dip test (solution G) contained TMAH, MEA, and ascorbic acid. Solutions not containing all of the constituents did not perform as well. The results suggest a synergistic cleaning effect is present when TMAH, MEA, and ascorbic acid co-exist in a cleaning solution, particularly in the preferred amounts.

EXAMPLE 4

Figure 5:
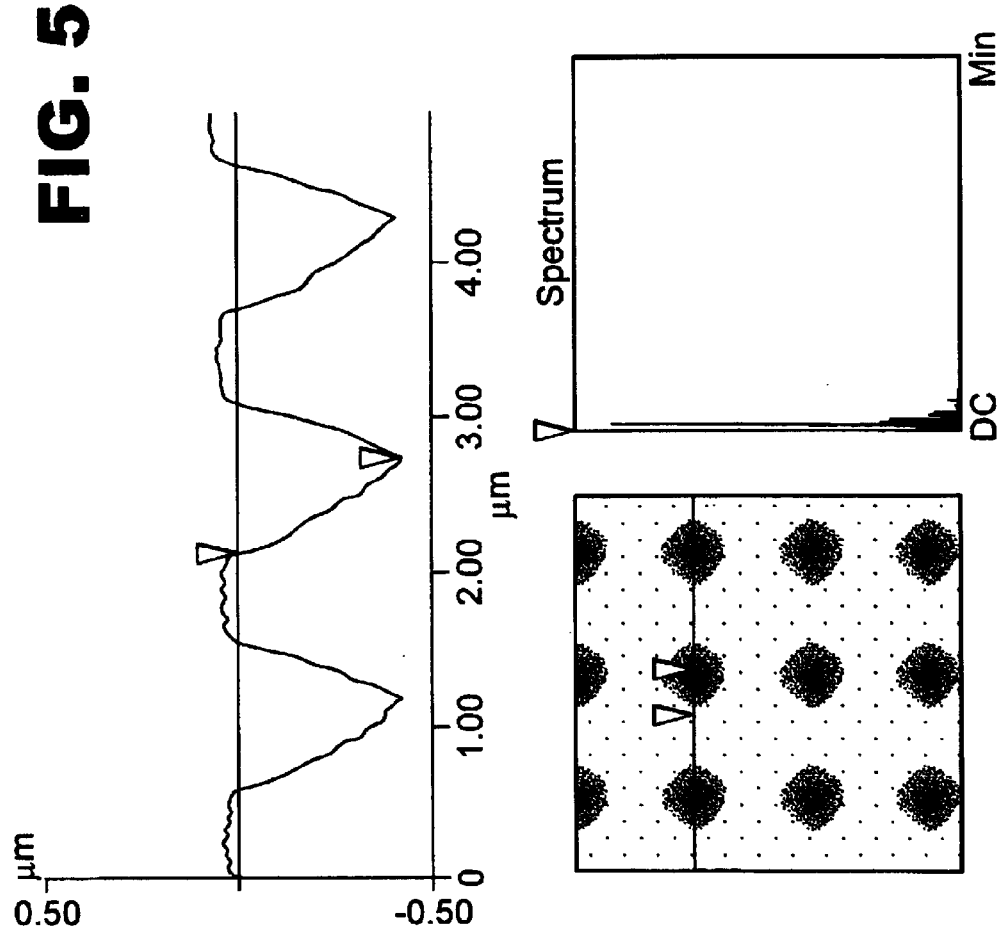
FIG. 5 is an atomic force microscopy (AFM) scan at 10 $\mu$m×10 $\mu$m area of a via prior to treatment with composition according to the present invention.

A cleaning solution according to the invention was prepared having a composition of 10.0 wt % TMAH, 18.0 wt % MEA, 7.0 wt % ascorbic acid, balance water. A partially etched via wafer was immersed in this solution at 70° C. for 30 minutes, then rinsed with DI water for about 1 minute, followed by $N_2$ blow dry. FIG. 5 shows an AFM sectional analysis of the 1 micron size via on the original wafer surface. The depth profile of the via is about 400 nm. Cross-sectional view of these vias clearly indicates that a significant amount of the residue polymer is left after the etching.

Figure 6:
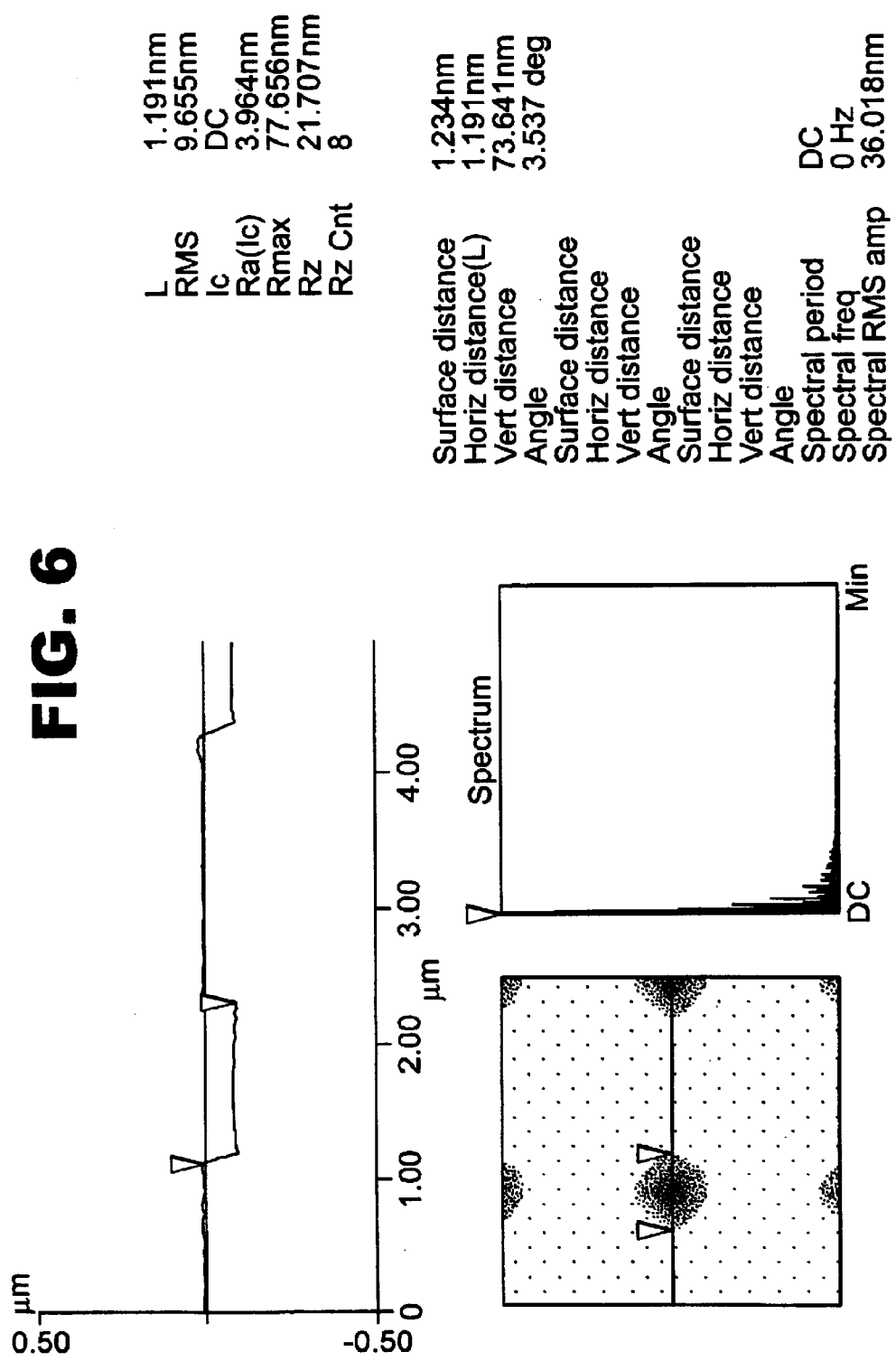
FIG. 6 is an atomic force microscopy (AFM) scan at 10 $\mu$m×10 $\mu$m area of the via of FIG. 5 after treatment with a solution according to the present invention.
Figure 7A:
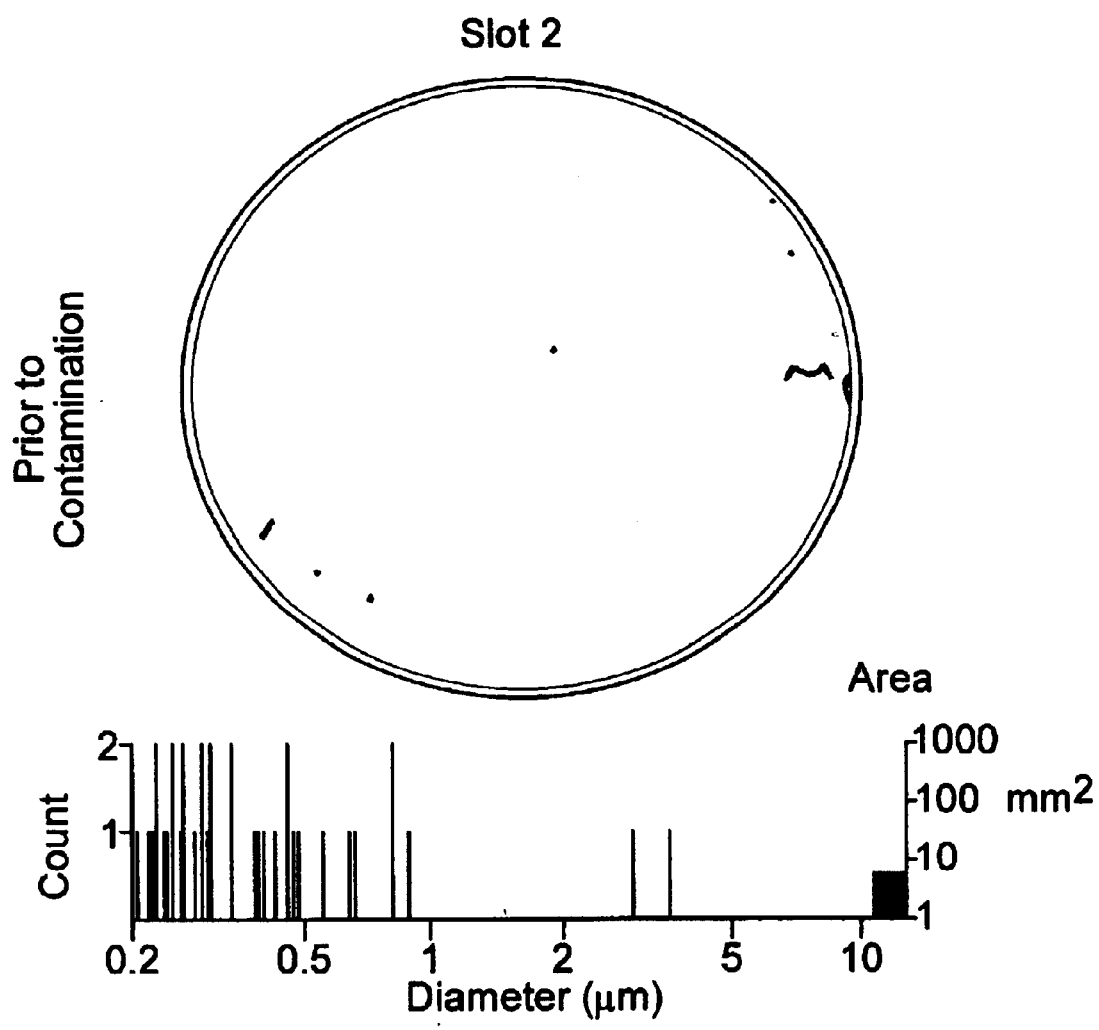
FIG. 7 is a representation of data illustrating particle count measurements on wafers before and after cleaning with a composition according to the present invention.
Figure 7B:
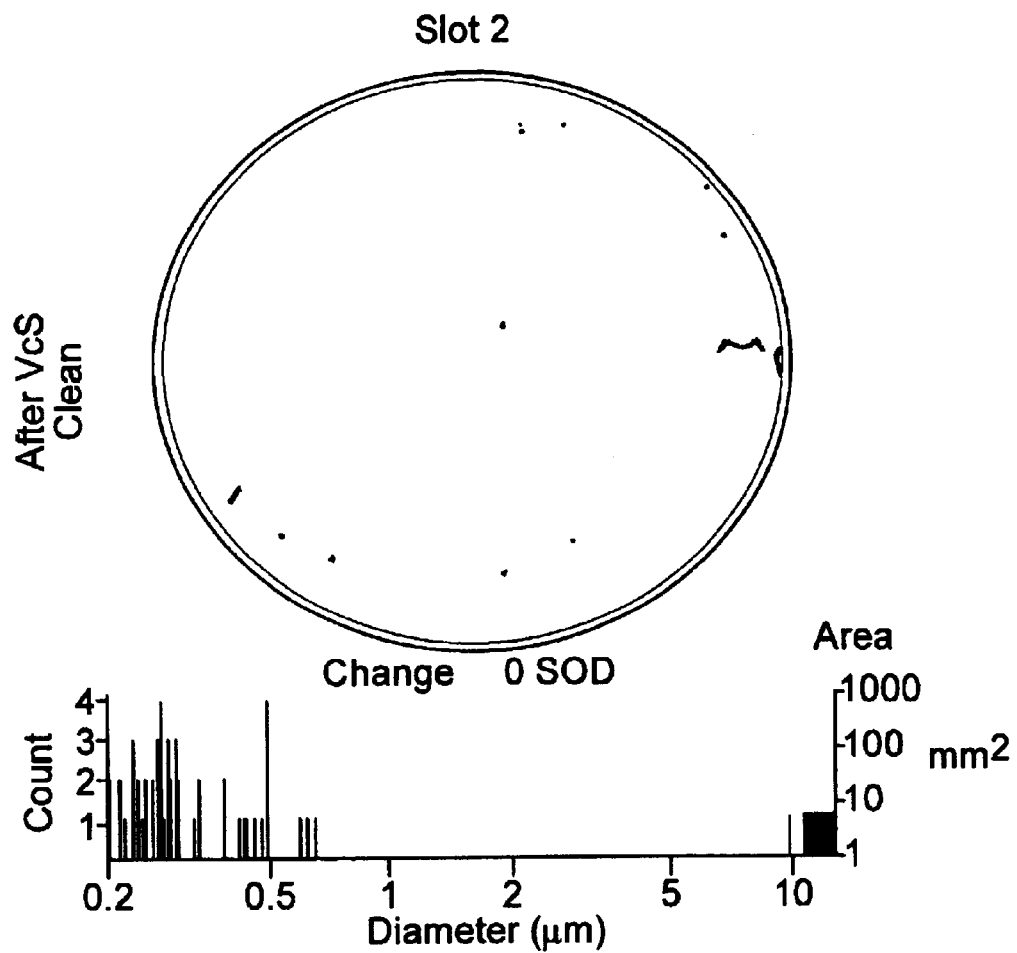
Figure 7C:
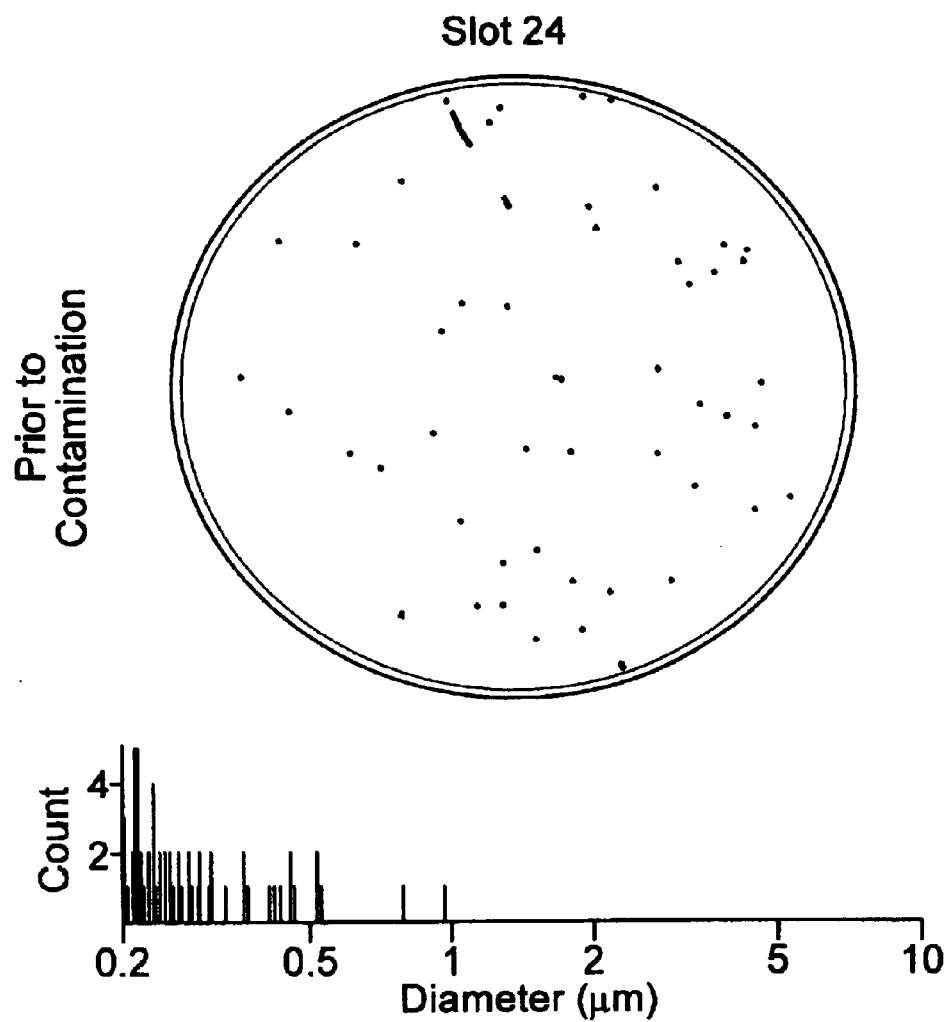
Figure 7D:
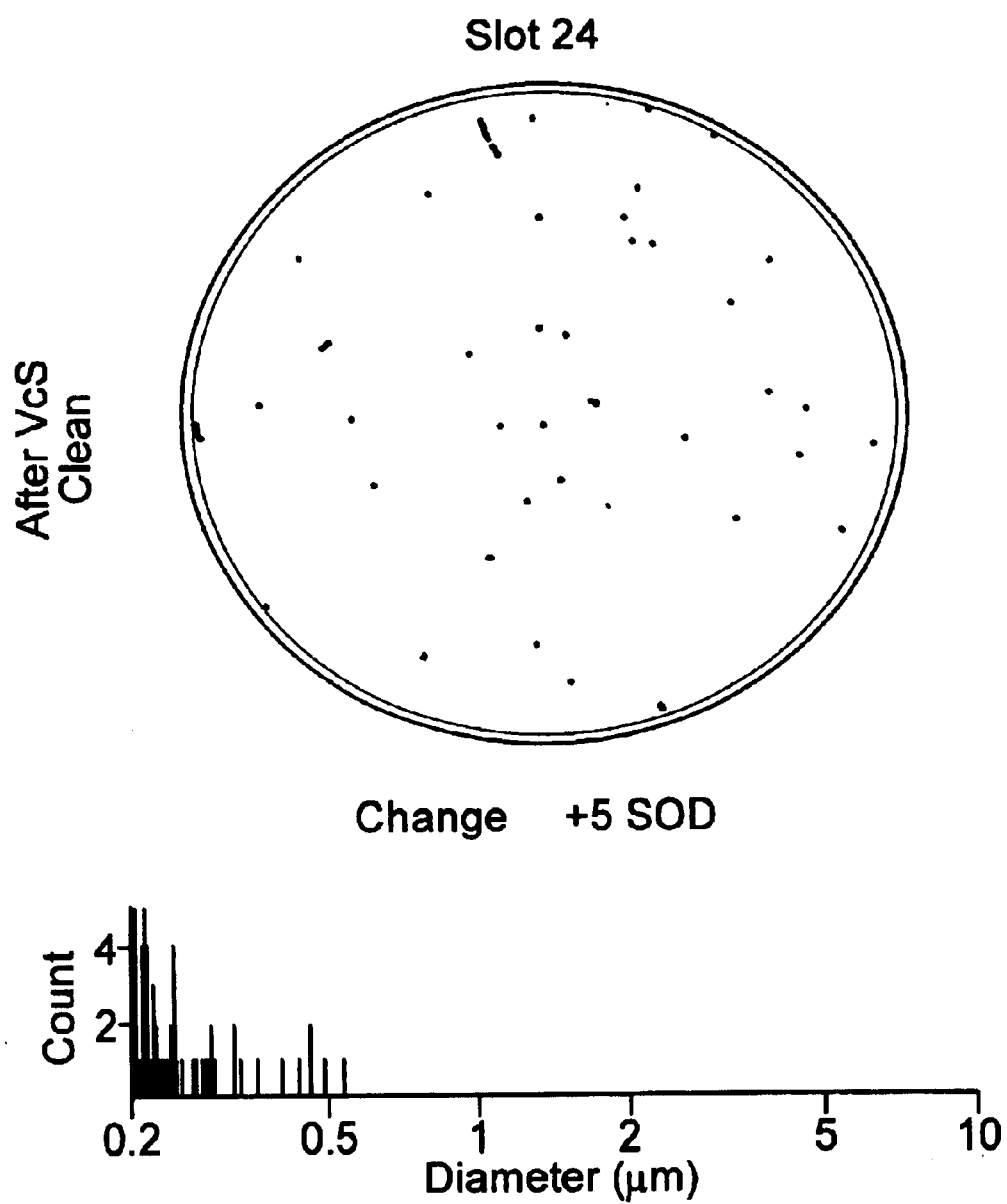
Figure 8A:
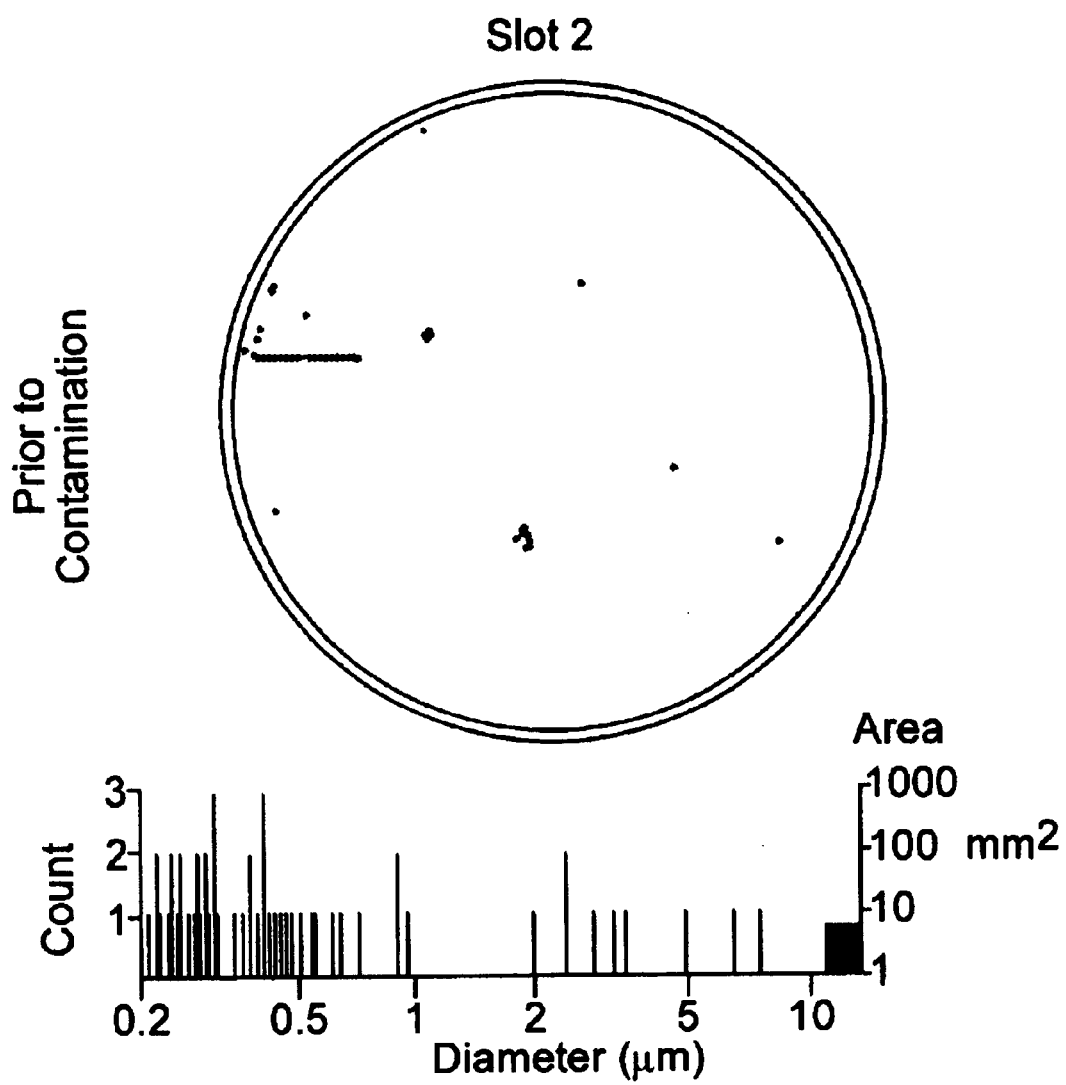
FIG. 8 is a particle count measurements on wafers prior to and after cleaning with a solution according to the present invention.
Figure 8B:
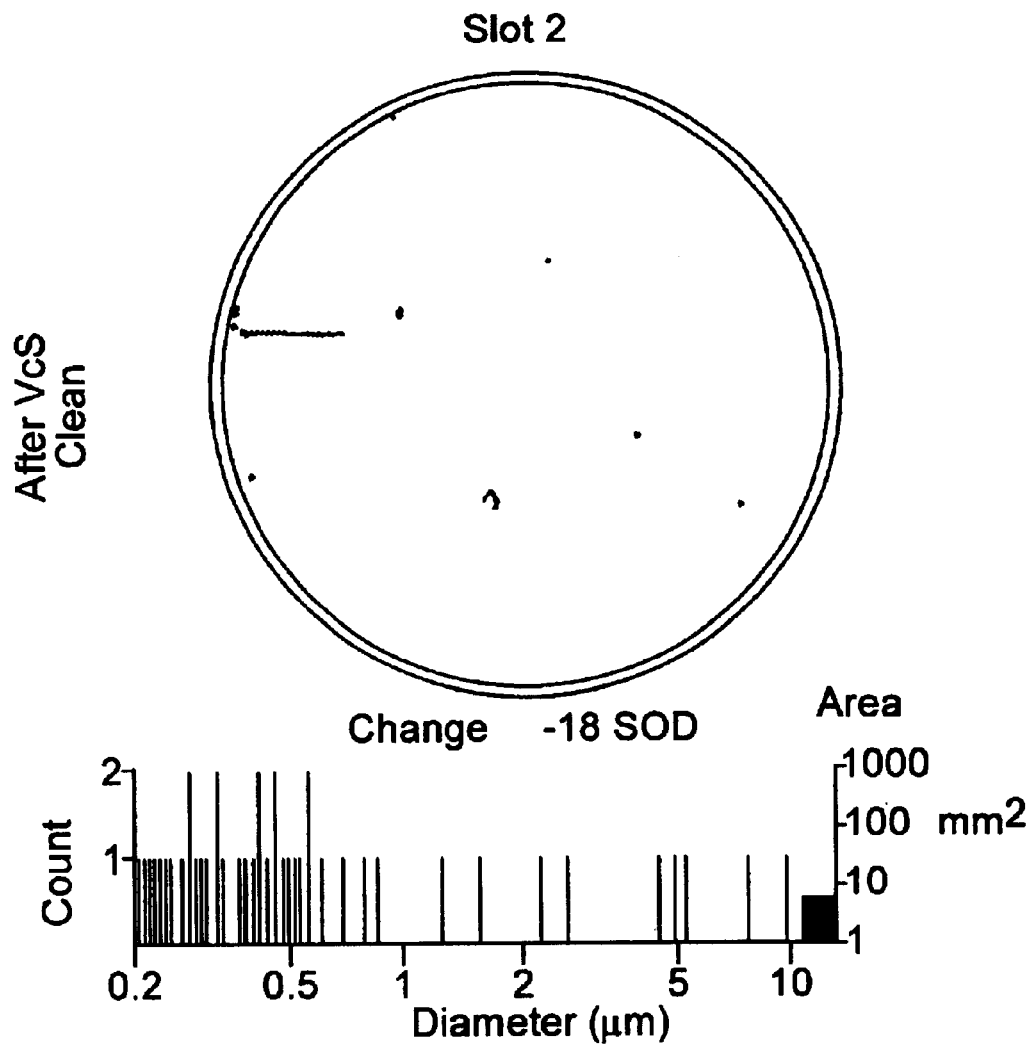
Figure 8C:
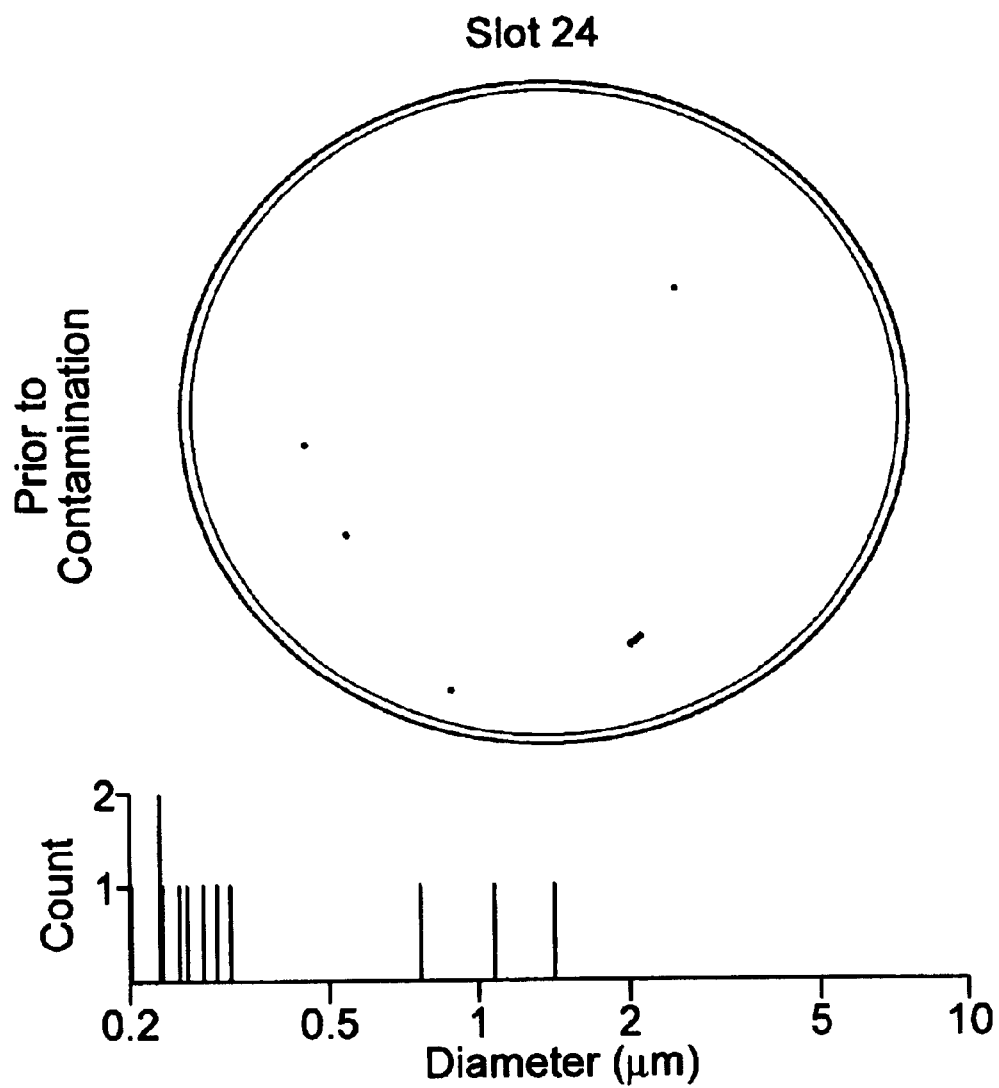
Figure 8D:
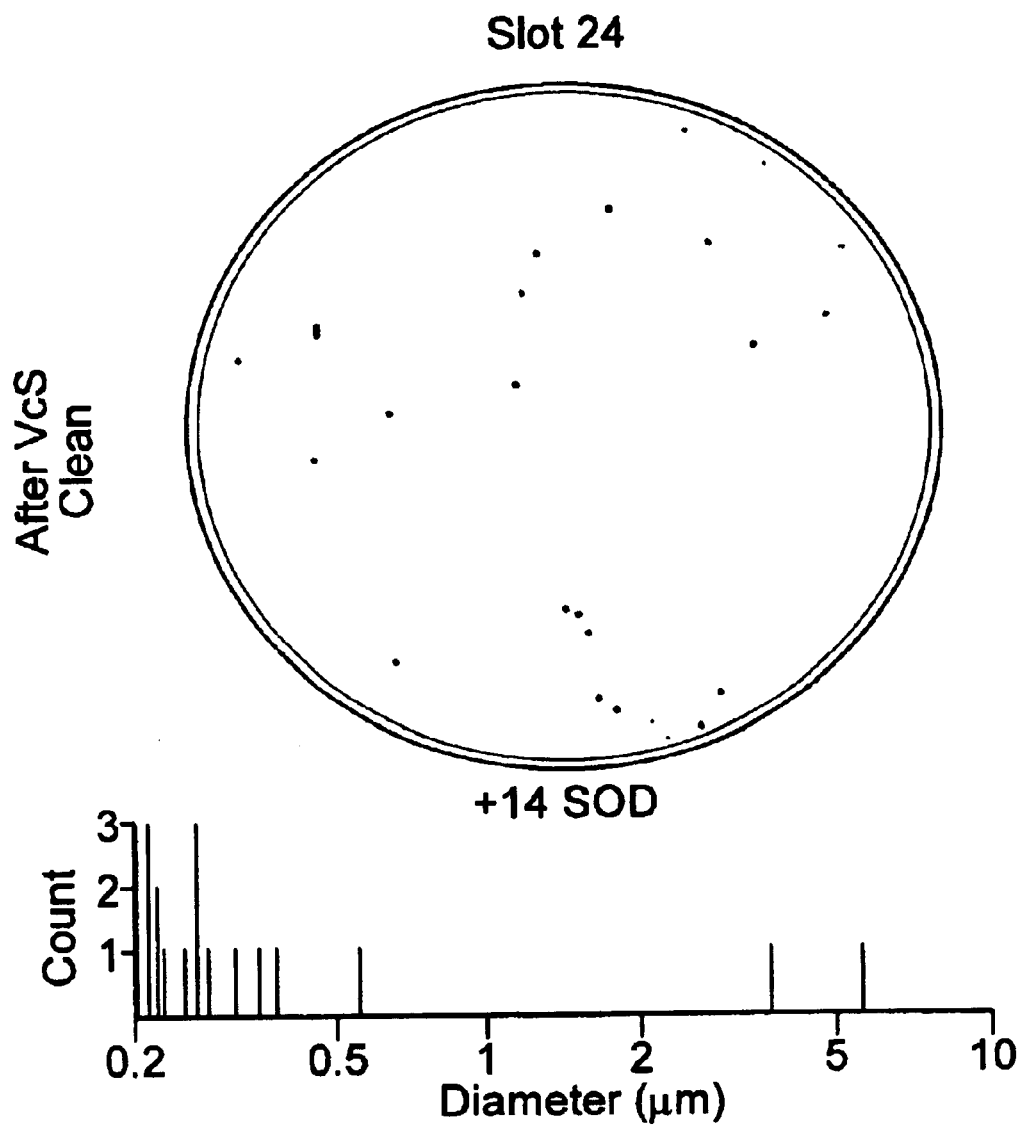

FIG. 6 shows the AFM sectional analysis of the same type of 1 micron size vias after treatment with the above solution. Cross-sectional views of these via reveals that they have a very shallow depth profile (on the average 80 nm). The contrast of the depth profile of the via before and after treatment is due to the removal of the photoresist layer from the wafer surface, which is estimated to be about 300 nm thick. The rectangular profile of via bottom (FIG. 6) also indicates that the sidewall polymer was removed by the above solution. These results suggest that the preferred embodiment is useful composition for via cleaning and photoresist stripping.

EXAMPLE 5

Two solutions were tested for post CMP cleaning application. Solution I (0.45 wt % MEA, 0.25 wt % TMAH and 0.175 wt % gallic acid, balance water) and Solution II (0.45 wt % MEA, 0.25 wt % TMAH and 0.175 wt % ascorbic acid, balance water) were used for a cleaning test using a Cobra-VcS station on TEOS wafers prior to, and after dipping in Olin Arch 10 K slurry solution. FIGS. 7–8 show the particle counts measured using a KLA-Tencor instrument from wafers cleaned with Solution I and Solution II. It is clear, that Solution II, a preferred-composition according to the invention, demonstrates a superior cleaning capability.

EXAMPLE 6

Concentrate solutions diluted to 1.25, 1.33, 2.5, and 5 wt % respectively were prepared and evaluated. A partially planarized ECD copper wafer piece was submersed in these stirred solutions for 30 minutes at two different temperature conditions (22° C. and 50° C.). Four point probe measurements for sheet resistance were made on these pieces prior to and after these treatments. Copper etch rates for the solutions were calculated. Concentrate A is 10.0 wt % TMAH, 18 wt % MEA, 7.0 wt % ascorbic acid, and the balance water. Concentrate B is 10.0 wt % TMAH, 18 wt % MEA, 7.0 wt % gallic acid, and the balance water. Results reported in angstroms per minute are set forth in Table IV.

TABLE IV

| Concentrate wt % | Concentrate Composition A | | Concentrate Composition B | |
|---|---|---|---|---|
| | Etch Rate At 22° C. | Etch Rate At 50° C. | Etch Rate At 22° C. | Etch Rate At 50° C. |
| 1.25 | 4.52 | 23.35 | 22.05 | 88.39 |
| 1.665 | 9.24 | 23.58 | 19.66 | 118.91 |
| 2.5 | 0.55 | 24.68 | 28.86 | 161.39 |
| 5 | 0.00 | 13.91 | 27.82 | 234.20 |

It is clear from the data in Table IV that concentrate composition A has superior corrosion inhibition properties to that of composition B.

EXAMPLE 7

Two concentrate solutions were made in the manner of Example 6 and diluted to 12.5 and 50 wt % respectively. A partially planarized ECD copper wafer piece was submersed in these stirred solutions for 10 minutes at constant temperature (22° C.). Four point probe measurements for sheet resistance were made on these pieces prior to and after these treatments. Sheet resistance changes are reported in milliohms per centimeter square in Table V.

TABLE V

| Concentrate wt % | Sheet Resistance Change | |
|---|---|---|
| | Concentrate Composition A | Concentrate Composition B |
| 12.5 | −0.0015 | 0.1742 |
| 50 | −0.0994 | 0.3307 |

It is clear from Table V that concentrate composition A has superior corrosion inhibition properties to that of concentrate composition B. Concentrate composition A also demonstrates an unexpected result in that there is a decrease in sheet resistance.

EXAMPLE 8

A series of cleaning solutions were prepared to show the relationship of ascorbic acid and gallic acid combinations with the TMAH and MEA concentrations held constant at 0.25 wt % TMAH and 0.45 wt % MEA respectively in an aqueous cleaning solution. The prepared cleaning solutions were evaluated for cleaning performance as set forth in Example 1. The prepared cleaning solutions were evaluated for the tendency to corrode copper with its data set forth in Example 2. These variances are shown in Table VI.

TABLE VI

Corrosion and Dip Test Data

| Formulation | Ascorbic Acid | Gallic Acid | RMS [Rq] 5 min dip | RMS [Rq] 30 min dip | Dip Test |
|---|---|---|---|---|---|
| Blank Cu | 0 | 0 | 1.167 | | X |
| P | 0.175 | 0 | 1.736 | 1.290 | 2 |
| Q | 0.131 | 0.044 | 1.996 | 2.578 | 1 |
| R | 0.088 | 0.088 | 1.956 | 7.679 | 1 |
| S | 0.044 | 0.131 | 2.634 | 8.804 | 1 |

All of the above formulations exhibit acceptable cleaning performance. The corrosion inhibition in formulation R and formulation S is marginal.

EXAMPLE 9

Figure 9:
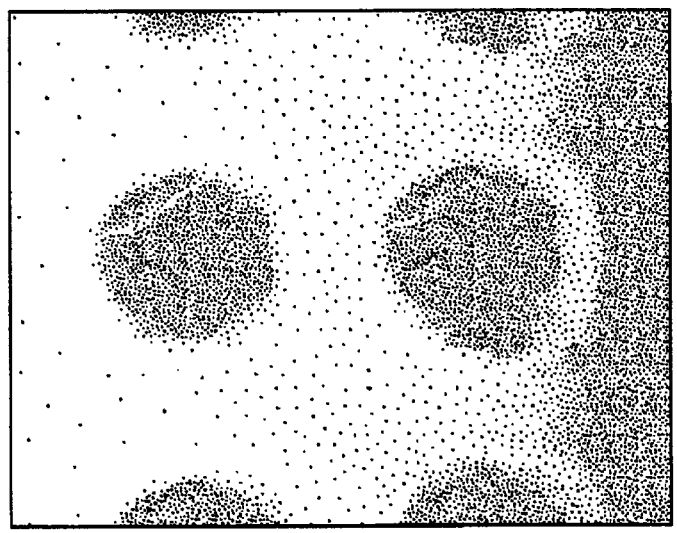
FIG. 9 is a scanning electron microscopy (SEM) image of a via structure prior to treatment with a composition according to the present invention.
Figure 10:
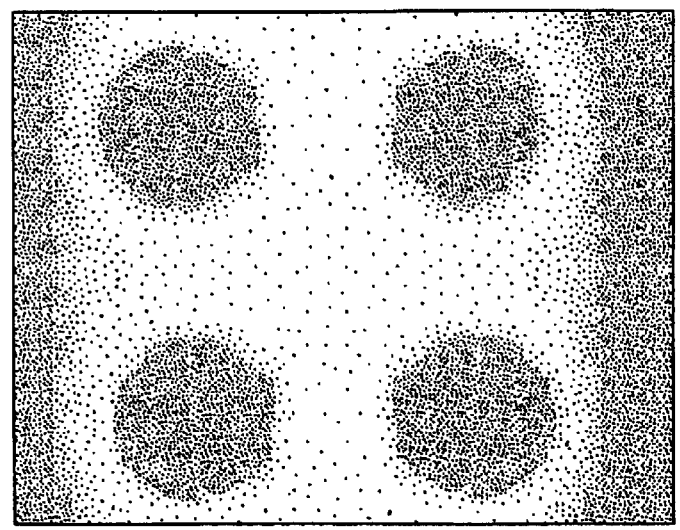
FIG. 10 is a scanning electron microscopy (SEM) image of a via structure after treatment with a solution according to the present invention.

Two concentrates (A-10.0 wt % TMAH, 18 wt % MEA, 7.0 wt % ascorbic acid, balance water; B 10 wt % TMAH, 18 wt % MEA, 7.0 wt % gallic acid, balance water) and diluted to 50 wt %. Copper via wafer pieces were submersed in these solution at 50° C. for one minute and the prior to and after samples were examined by scanning electron microscopy to determine the level of cleaning and for corrosion damage to the substrates. The composition with concentrate A showed complete cleaning and no evidence of damage to the substrates whereas composition with concentrate B did not completely clean the contamination from the wafer. FIG. 9 is the via structure prior to treatment and FIG. 10 illustrates the cleaning of concentrate composition A diluted to 50 wt %.

Having thus described our invention, which is not limited to the particular embodiments shown and described herein, what is desired to be secured by Letters Patent of the United States is set forth in the appended claims.

What is claimed:

1. A cleaning solution for cleaning a copper-containing integrated circuit after chemical-mechanical polishing during manufacture of said integrated circuit, the cleaning solution comprising:

0.05 wt % to 12.4 wt % a quaternary ammonium hydroxide selected from the group consisting of tetraalkylammonium hydroxide, where the alkyl contains C atoms numbered from 1 to 10, and combinations thereof, 0.2 wt % to 27.8 wt % a polar organic amine selected from the group consisting of monoethanolamine, aminoethylethanolamine, N-methylaminoethanol, aminoethoxyethanol, diethanolamine, triethanolamine, $C_2$–$C_5$ alkanolamines, and combinations thereof, 0.1 wt % to 4.0 wt % of an organic acid being gallic acid 1.0 wt % to 10.9 wt % a corrosion inhibitor selected from the group consisting of ascorbic acid (Vitamin C), L(+)-ascorbic acid, isoascorbic acid, ascorbic acid derivatives, and combinations thereof, balance deionized water and;

wherein the alkalinity of the solution is greater than 0.073 milliequivalents base per gram.

2. A cleaning solution for cleaning copper-containing microelectronic substrates, the cleaning solution comprising:

1. 0.05 to 12.4 wt % tetramethylammonium hydroxide;
2. 0.2 to 27.8 wt % monoethanolamine;
3. 0.1 to 4 wt % gallic acid;
4. 0.2 to 10.9 wt % ascorbic acid and
5. deionized water, wherein the alkalinity of the solution is greater than 0.073 milliequivalents base per gram.

3. The cleaning solution of claim 2, wherein the alkalinity of the solution is greater than 0.073 milliequivalents base per gram.

4. A cleaning solution of claim 1, wherein said corrosion inhibitor is selected from the group consisting of ascorbic acid, L-ascorbic acid, isoascorbic acid and ascorbic acid derivatives.

5. A cleaning solution for post-CMP cleaning, consisting essentially of 0.05 wt % to 1.25 wt % tetramethylammonium hydroxide, 0.2 wt % to about 2.25 wt % monoethanolamine, 0.1 wt % to 1 wt % gallic acid; and 0.10 to about 0.9 wt % ascorbic acid, balance water.

6. A via cleaning solution consisting essentially of 1.8 wt % to 12.4 wt % tetramethylammonium hydroxide, 2.0 wt % to about 27.8 wt % monoethanolamine, 0.1 wt % to 4 wt % gallic acid; 0.2 wt % to 10.9% ascorbic acid, balance water.

7. A cleaning solution for cleaning a copper-containing integrated circuit after chemical-mechanical polishing during manufacture of said integrated circuit consisting essentially of:

from 1.5 wt % to 12.5 wt % of a concentrate consisting of 1.8 wt % to 12.4 wt % of quaternary ammonium hydroxide wherein the alkyl contains one of $C_1$ through $C_{10}$ atoms or combinations of $C_1$ through $C_{10}$ atoms, 2.0 wt % to 27.8 wt % of a polar organic amine selected from the group consisting of monoethanolamine, aminoethylethanolamine, N-methylaminoethanol, aminoethoxyethanol, diethanolamine, triethanolamine, $C_2$–$C_5$ alkanolamines, and mixtures thereof; 0 wt % to 4 wt % of gallic acid 1.0 wt % to 10.9 wt % corrosion inhibitor selected from the group consisting essentially of ascorbic acid (Vitamin C), L(+)-ascorbic acid, isoascorbic acid, ascorbic acid derivatives, and combinations thereof, balance water; and, 87.5 wt % to 98.5 wt % deionized water, with the alkalinity of the solution being greater than 0.073 milliequivalents base per gram.

8. A cleaning solution for cleaning copper-containing microelectronic substrates, the cleaning solution consisting of 1.5 wt % to 12.5 wt % of a concentrate consisting of 1.8 to 12.4 wt % tetramethylammonium hydroxide, 2 to 27.8 wt % monoethanolamine 0.1 to 4.0 wt % gallic acid 1.0 to 10.9 wt % ascorbic acid, balance water, and 87.5 to 98.5 wt % deionized water, the solution having an alkalinity greater than 0.073 milliequivalents base per gram of solution.

* * * * *

UNITED STATES PATENT AND TRADEMARK OFFICE
CERTIFICATE OF CORRECTION

PATENT NO. : 6,723,691 B2
DATED : April 20, 2004
INVENTOR(S) : Naghshineh et al.

It is certified that error appears in the above-identified patent and that said Letters Patent is hereby corrected as shown below:

Column 12,
Line 41, after thereof; delete "0" and insert -- 0.1 --.

Signed and Sealed this

Tenth Day of August, 2004

JON W. DUDAS
*Acting Director of the United States Patent and Trademark Office*